US006856635B2

(12) United States Patent
Sai et al.

(10) Patent No.: US 6,856,635 B2
(45) Date of Patent: Feb. 15, 2005

(54) SURFACE LIGHT EMITTING TYPE SEMICONDUCTOR LASER HAVING A VERTICAL CAVITY

(75) Inventors: Hironobu Sai, Kyoto (JP); Jun Ichihara, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/274,950

(22) Filed: Oct. 22, 2002

(65) Prior Publication Data

US 2003/0076864 A1 Apr. 24, 2003

(30) Foreign Application Priority Data

Oct. 23, 2001 (JP) ........................................ 2001-325392

(51) Int. Cl.[7] ................................................. H01S 5/00
(52) U.S. Cl. .............................. 372/43; 372/44; 372/45; 372/46
(58) Field of Search ..................................... 372/43–46

(56) References Cited

U.S. PATENT DOCUMENTS

| | | | | |
|---|---|---|---|---|
| 5,245,622 A | * | 9/1993 | Jewell et al. .................. | 372/45 |
| 5,493,577 A | * | 2/1996 | Choquette et al. ............ | 372/46 |
| 5,577,064 A | * | 11/1996 | Swirhun et al. ............... | 372/96 |
| 5,606,572 A | * | 2/1997 | Swirhun et al. ............... | 372/96 |
| 5,818,861 A | * | 10/1998 | Tan et al. ...................... | 372/46 |
| 6,021,146 A | * | 2/2000 | Jiang et al. .................... | 372/46 |
| 6,031,243 A | * | 2/2000 | Taylor .......................... | 257/13 |
| 6,069,905 A | * | 5/2000 | Davis et al. ................... | 372/43 |
| 6,185,241 B1 | * | 2/2001 | Sun .............................. | 372/96 |
| 6,618,414 B1 | * | 9/2003 | Wasserbauer et al. ......... | 372/45 |
| 6,621,843 B2 | * | 9/2003 | Yoo et al. ...................... | 372/45 |

* cited by examiner

*Primary Examiner*—Don Wong
*Assistant Examiner*—Leith Al-Nazer
(74) *Attorney, Agent, or Firm*—Rabin & Berdo, PC

(57) ABSTRACT

A lower multilayer reflection film (2), a light emitting layer forming portion (6) and an upper multilayer reflection film (8) are sequentially formed on a substrate (1) to form a semiconductor laminated portion (9), and a current injection region A is formed at a part of the semiconductor laminated portion so as to emit light from the surface in the center thereof. And, according to the present invention, the current injection region A is formed so as to be deflected from a center of the substrate. As a result, there is provided a surface light emitting type semiconductor laser capable of monitoring a light emitting power correctly and controlling it automatically in order to achieve the constant light emitting power in a case where the surface light emitting type laser chip is used as a light source for a pickup or the like.

14 Claims, 4 Drawing Sheets

SURFACE LIGHT EMITTING TYPE SEMICONDUCTOR LASER HAVING A VERTICAL CAVITY

FIELD OF THE INVENTION

The present invention relates to a surface light emitting type semiconductor laser used as a light source for a pickup, a laser beam printer or the like. More specifically, it relates to a surface light emitting type semiconductor laser having a structure in which its output can be precisely monitored.

BACKGROUND OF THE INVENTION

In regard to the surface light emitting type semiconductor laser, since a laser beam is outputted from the surface of laminated semiconductor layers in the vertical direction, it is not necessary to mount a laser chip laterally, and it is easily and precisely positioned. These make it convenient to use. As a conventional surface light emitting type semiconductor laser, the structure shown in FIG. 5 is well known. More specifically, on a semiconductor substrate 41 formed of GaAs, for example, there is formed a lower multilayer reflection film 42 called DBR (Distributed Brag Reflector) having a structure in which semiconductor layers having different refractive indexes are laminated so as to reflect the light having a specific frequency band. Then, there are formed thereon a light emitting layer forming portion 46 comprising a lower spacer layer, an active layer and an upper spacer layer which are not shown, and an upper multilayer reflection film 48 comprising the DBR. Then, an insulating region 47 is formed by implanting ion such as proton to a part except for a current injection region A serving as an emission region. Upper and lower electrodes which are not shown are provided on the front surface of laminated semiconductor layers and the back surface of the semiconductor substrate so that the laser beam is outputted from a not-shown small outlet which is formed on the upper electrode and about several $\mu$m in diameter, through the upper multilayer reflection film 48 whose reflection factor is made to be a little smaller than the lower multilayer reflection film 42.

In addition, as shown in FIG. 6, instead of insulating a part of semiconductor layers by ion implantation using proton, recently there has been proposed a semiconductor laser having a structure in which a semiconductor layer to be selectively oxidized which comprises AlAs or the like and is likely to be oxidized by water vapor or the like is intervened between the light emitting layer forming portion 46 and the upper multilayer reflection film 48, its outer peripheral part is etched away such that the current injection region and a certain region of its outer periphery are left in the shape of mesa and then, oxidation treatment is performed such that the semiconductor layer is selectively oxidized from the exposed peripheral part under the atmosphere of water vapor but the current injection region A is not oxidized to form a current limiting layer 49. Thus, the current injection region A can be formed within a desired range.

Either of the above described semiconductor laser has a structure in which the current injection region and the outlet of the laser beam are formed in the center of the chip from a viewpoint of symmetry in manufacturing a product. Meanwhile, in this kind of surface light emitting type semiconductor laser as well as an end face emission type semiconductor laser, it is necessary to automatically control the amount of emitting light by monitoring the output of the semiconductor laser such that it is constant when it is used as the light source of the pickup or the like. However, since the lower multilayer reflection film 42 in the surface light emitting type semiconductor laser described above is formed to have high reflection factor of 99.9% or more and the light scarcely comes out of the back surface of the semiconductor substrate 41, the amount of emitting light cannot be monitored by the output from the opposite side of emission surface, that is, the back surface, which is unlike in the end face emission type semiconductor laser. Therefore, as shown in FIG. 7, the following has been attempted, that is, a surface light emitting type semiconductor laser chip 12 is mounted on a light receiving element 13 and the reflected light from a transparent body 26 provided in a transmission window of a cap (not shown) is detected and monitored by the light receiving element 13.

As described above, when the surface light emitting type semiconductor laser is used as the light source of the pickup or the like, since the light coming out of the opposite side of the emitting surface can be hardly used in monitoring the amount of emitting light, it has been thought that some light reflected from the transparent body in the transmission window is used for monitoring the light. However, the reflected light from the transparent body is very scarce such as approximately 10%, the size of the surface light emitting type semiconductor laser chip is 200 $\mu$m to 300 $\mu$m square and the outlet 10a of the laser beam is several $\mu$m or so in a diameter. Thus, when the distance L between the surface of the laser chip 12 and the transparent body 26 is decreased, the area of the reflected light (projected area) in the light receiving element surface becomes very small. When a divergent angle $\omega$ (referring to FIG. 7) of the laser beam is around 16° and the distance L is 1 mm or less, the projected area is almost the same size as the laser chip. In this case, the reflected light from the transparent body 26 mostly returns to the surface of the laser chip 12 without being detected by the light receiving element 13 and consequently the reflected light cannot be precisely monitored.

SUMMARY OF THE INVENTION

The present invention was made in consideration of the above problem and it is an object of the present invention to provide a surface light emitting type semiconductor laser having a vertical cavity in which a light emitting power can be accurately monitored and automatically controlled such that the constant light emitting power can be always obtained even when the surface light emitting type semiconductor laser chip is used as the light source of the pickup or the like.

According to the present invention, a surface light emitting type semiconductor laser having a vertical cavity comprises; a substrate, and a semiconductor laminated portion which has a lower multilayer reflection film, a light emitting layer forming portion and an upper multilayer reflection film which are sequentially formed on the substrate, wherein a current injection region is formed at a part of the semiconductor laminated portion so that a light can be emitted from a surface in a center thereof and the current injection region is deflected from a center of the substrate.

In this structure, since the outlet of the laser chip is deflected from the center of the laser chip (substrate), distribution of the reflected light from the transparent body, which centers around the outlet, returns to the light receiving element out of the laser chip on the deflected side. Consequently, even if the distance between the light receiving element and the transparent body is short and the projected (shadow) area is small, the reflected light can be sufficiently detected by the light receiving element. More specifically, as will be described hereinafter, as a result of an ardent examination by the inventors, it was found that in regard to the range of the reflected light on the surface of the light receiving element, if about the half of the range of 30 µm or more from the outlet of the laser beam (the range larger than d in FIG. 2) is directly projected on the light receiving element, the light receiving amount which is necessary for the output to be monitored can be detected. More specifically, it was found that even if the distance between the laser chip and the transparent body is as close as about 1 mm, the monitor output can be sufficiently obtained by separating the outlet of the laser beam from the center of the laser chip toward one side by 20 µm or more, that is, by one-ninth or more of the length of one side.

It is preferable that the substrate is in the form of a square and the current injection region is formed so as to be closer to one corner of the square substrate because the range of the reflected light projected directly on the light receiving element is in the direction of approximately 270° in the periphery of the outlet so that the monitoring output is increased even if the amount of deflection is small.

According to the semiconductor laser appropriate to be used for the light source of a pickup or the like in accordance with the present invention, it comprises a light receiving element provided on one side of a stem, a surface light emitting type laser chip mounted onto the surface of the light receiving element, and a cap having a light transmission window formed of a transparent body in its central portion and being provided so as to cover the laser chip, wherein a current injection region of the laser chip is deflected from a center of the substrate, and the light receiving element and the laser chip are provided such that the outlet of the laser beam of the laser chip is positioned just under a central portion of the transmission window.

DETAILED DESCRIPTION

Figure 1A:
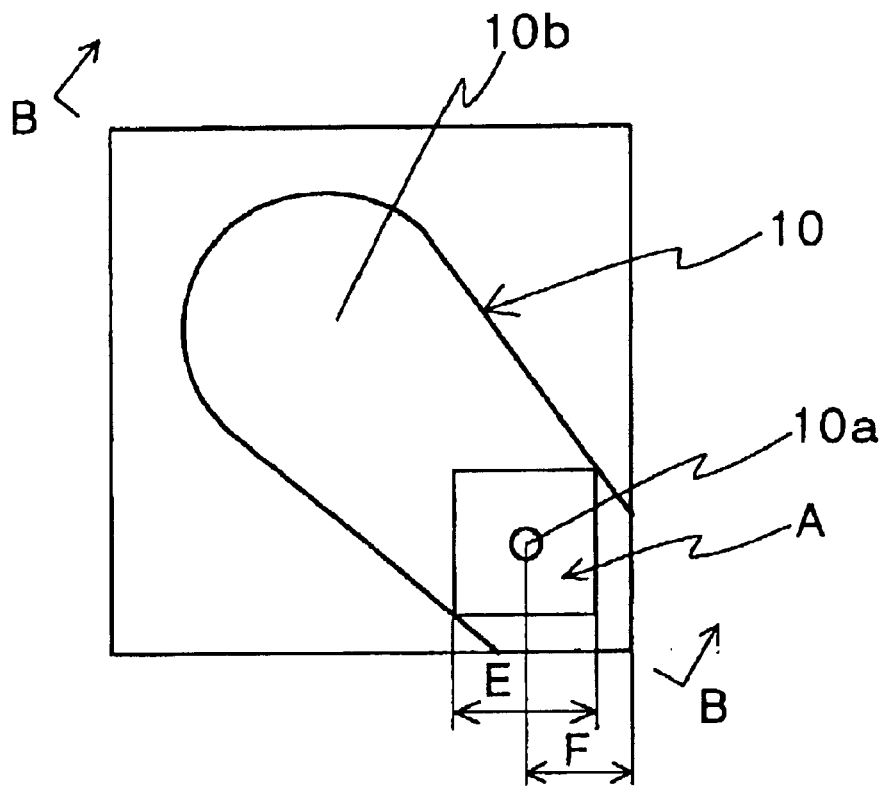
FIGS. 1A and 1B are a plan view and a sectional view showing a semiconductor laser chip in accordance with the present invention.
Figure 1B:
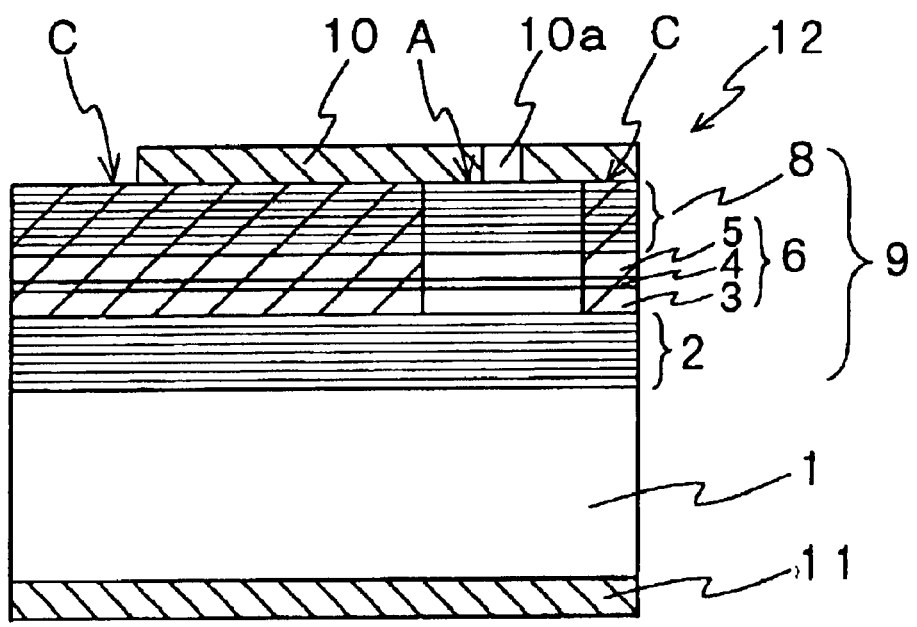

Then, a description will be made of a semiconductor laser having a vertical cavity of a surface light emitting type in accordance with the present invention. According to a chip structure of a semiconductor laser of the present invention, as its plan view is shown in FIG. 1A and its sectional view taken along B-B is shown in FIG. 1B, a lower multilayer reflection film 2, a light emitting layer forming portion 6 and an upper multilayer reflection film 8 are sequentially formed on a substrate 1 to provide a semiconductor laminated portion 9 and a current injection region A is formed at a part of the semiconductor laminated portion 9 such that light can be emitted from a surface of a center thereof. Thus, according to the present invention, it is characterized in that the current injection region is formed so as to be deflected from a center of the substrate.

As described above, when the light emitting power of the surface light emitting type semiconductor laser is monitored, the laser chip is mounted on the surface of the light receiving element and the light emitting power (amount of emitting light) is detected by the light receiving element using the reflected light from the transparent body of the transmission window provided so as to be opposed to the laser chip surface. However, according to the above described method, when the distance between the laser chip and the transparent body provided so as to be opposed to the surface of the laser chip is small, the reflected light from the transparent body mostly returns onto the surface of the laser chip so that it is not detected by the light receiving element. Then, in order to solve the above problem, as a result of an ardent examination by the inventors, it was found that the output to be monitored can be sufficiently detected by deflecting the outlet of the laser beam from the center of the laser chip toward one side by 20 µm or more, that is, ⅑ to ⅛ or more of the length of the side even if the distance between the laser chip and the transparent body becomes short such as 1 mm or so.

Figure 2:
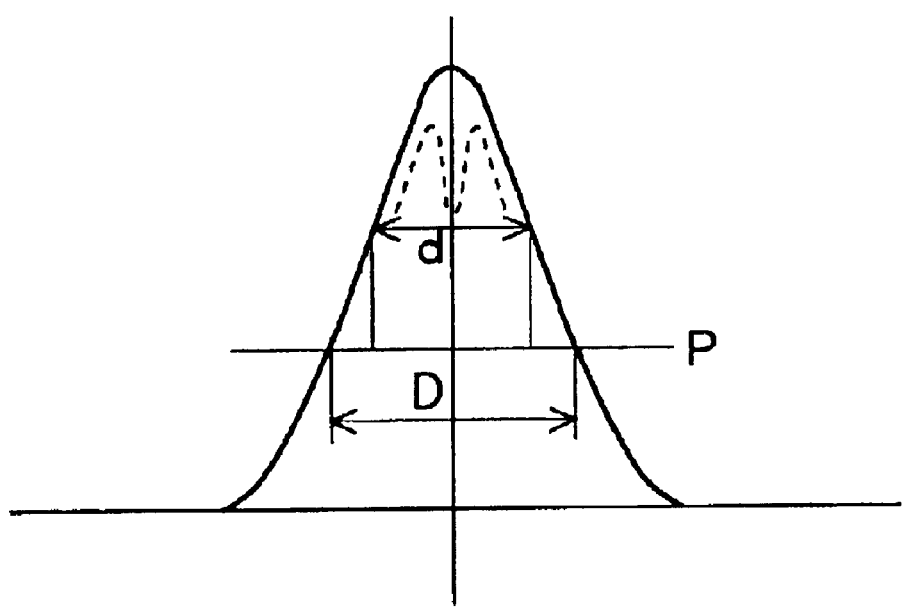
FIG. 2 is a view showing intensity distribution of reflected light of beam outputted from the laser chip.

More specifically, as a consequence of the examination of intensity distribution of the reflected light from the transparent body, as shown in FIG. 2, the light intensity distribution shows Gaussian distribution almost regularly at a distance from the center although there is some irregularity in the center (in which the intensity is low in the center and peaks around the center as shown by dotted line in FIG. 2) because of oscillation characteristics of a laser chip. As the distance between the laser chip and the transparent body becomes short, the position of P in FIG. 2 rises up on the drawing and as it becomes long, P falls down. The distance between the laser chip and the transparent body is at least 1 mm or so and in this case, the distribution range (diameter D) of the reflected light is about 280 µm. Since the light intensity becomes high as the position of P rises up, if the range which is 100 µm or more from the center (diameter d is 200 µm or more) is applied to the light receiving element, about 0.07 mW corresponding to about 70% of the reflected light of the laser chip can be detected, which means the light emitting power can be precisely monitored.

Therefore, it is required that the range of d or more in diameter comes out of the laser chip, but the laser chip cannot be made smaller because of security for a bonding pad and easiness of handling. Thus, a further examination was made to achieve the same effect by deflecting the outlet of the laser chip. Then, it was found that the light emitting power can be sufficiently monitored in the case where the distance between the outlet of the laser beam and the end face (end line) of the laser chip is within a range of 70 µm or less, more preferably 40 µm or less (the amount of reflected light becomes half because one half of the reflected light comes onto the light receiving element and the other half comes onto the laser chip). In addition, if the distance between the laser chip and the transparent body becomes long, the amount of emission is surely increased, which means the light emitting power can be sufficiently monitored. Furthermore, if the position of the outlet of the laser beam is deflected toward the corner of the laser chip, not half but ¾ of the range of the reflected light comes out of the laser chip, so that the outlet may be closer to the center of the chip.

Regarding to the above described facts, as a result of a further examination by inventors, it was found that the light emitting power can be sufficiently monitored by forming the current injection region A such that the outlet is formed at a position where a distance F from the end face of the laser chip (referring to FIG. 1A) is within 70 $\mu$m, more preferably 40 $\mu$m. In this case, however, it is necessary to secure the current injection region A (whose side length E is 30 $\mu$m or so) and to consider tolerance in dicing it, so that it is preferable to separate the region A from the end face by 10 $\mu$m to 20 $\mu$m or more. From the above viewpoints, the light emitting power can be sufficiently monitored by forming the current injection region such that the position of the outlet of the laser beam is positioned within a range of 20 $\mu$m to 70 $\mu$m, more preferably, 20 $\mu$m to 40 $\mu$m from the end face of the laser chip regardless of the distance between the laser chip and the transparent body.

The semiconductor laminated portion 9 is provided such that the lower multilayer reflection film 2, the light emitting layer forming portion 6 and the upper multilayer reflection film 8 are sequentially formed on, for example an n-type GaAs substrate 1. The lower multilayer reflection film 2 and the upper multilayer reflection film 8 are formed as DBR (Distributed Brag Reflection) using Brag reflection by alternately laminating layers having different refractive indexes such as $Al_{0.9}Ga_{0.1}As$ and $Al_{0.2}Ga_{0.8}As$, for example, with the thickness $\lambda/4$ ($\lambda$ is a wavelength of light emission in an active layer). If the difference in refractive index between the multilayer reflection films 2 and 8 is large, a high reflection factor can be obtained with the small number of laminated layers and if the difference in refractive index is small, the high refraction factor can be obtained by laminating many more couples of layers. For example, the lower multilayer reflection film 2 is formed by laminating 33 couples of above described layers of composition such that its reflection factor is 99.999% or more and the upper multilayer reflection film 7 is formed by laminating 23 couples of layers such that its reflection factor is lower than that of the lower multilayer reflection film 2, that is, about 98% to 99%, so that one part of them can be emitted.

The light emitting layer forming portion (double hetero structure) 6 has a structure in which the active layer 4 is sandwiched by lower and upper spacer layers 3 and 5 to confine a carrier in the active layer 4, which are formed of AlGaAs based compound semiconductor such as $Al_{0.6}Ga_{0.4}As$ having a band gap larger than that of the active layer 4. The active layer 4 is formed of a material having a band gap so as to have a desired light emitting wavelength and formed into a bulk structure or single or multiple quantum well structure. Since the active layer 4 has the multiple quantum well (MQW) structure, its threshold value is low like the semiconductor laser having a stripe structure, which is preferable. In the case of the multiple quantum well structure, a MQW structure is adopted in which a well layer is made of $Al_{0.3}Ga_{0.7}As$ by 7 nm or so and a burrier layer is made of $Al_{0.6}Ga_{0.4}As$ by 10 nm or so, and they are alternately laminated until three well layers or so are formed.

An insulating region C is formed by implanting, for example, proton or the like from the surface of the semiconductor laminated portion 9 to a part except for the current injection region A. At this time, as described above, the insulating treatment is performed such that the current injection region A is deflected toward the end face of the chip. In addition, in practice, since the semiconductor layers are laminated for a number of laser chips on a large wafer substrate and then divided into each chip by dicing it, the insulating step is performed in the same manner as that of a prior method on the wafer and when the wafer is diced, the current injection region A is made to be deflected. The degree of the deflection is so as described above.

Then, metal such as Au/Ti is provided on the surface by vapor deposition or the like and then it is patterned to form an upper electrode 10. In addition, metal such as Au/Au—Ge—Ni or the like is provided on the back surface of the semiconductor substrate 1 by vapor deposition or the like to form the lower electrode 11. At the time of patterning of the upper electrode 10, an outlet 10a is formed in the center of the current injection region A in a size of about several $\mu$m in diameter. Reference numeral 10b designates a bonding part.

Figure 3:
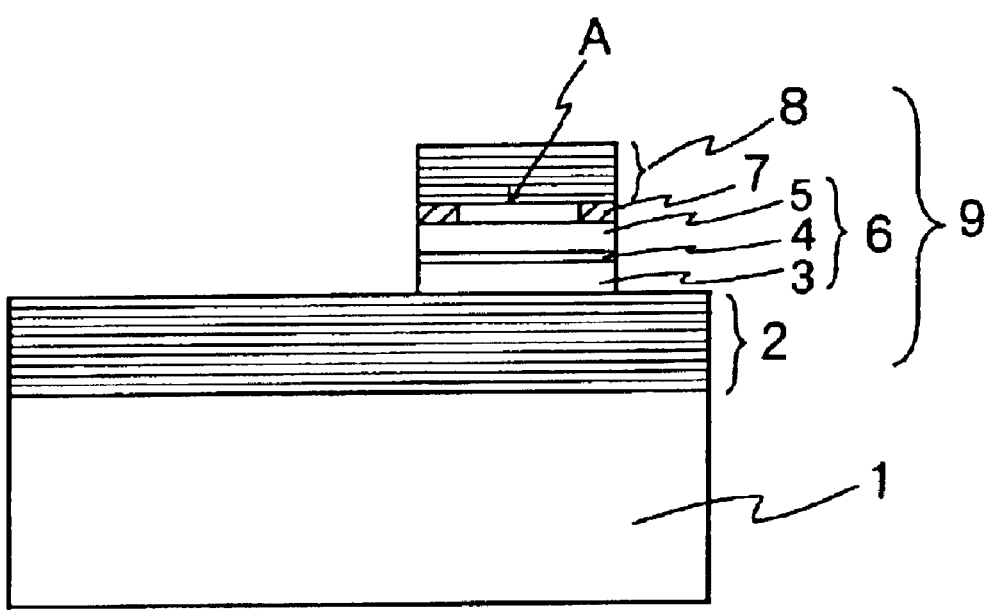
FIG. 3 is a sectional view showing another example of a semiconductor laser chip in accordance with the present invention.

Although the current injection region A is formed by insulating the peripheral part thereof in the above described example, the surface light emitting type semiconductor laser is not limited to the structure as shown in FIG. 1B and it may have a structure in which a current blocking layer is buried in the semiconductor laminated portion as shown in FIG. 3. In FIG. 3, since the multilayer reflection films 2 and 8 and the light emitting layer forming portion 6 are the same as shown in FIG. 1B, the same reference numerals are allotted to the same parts and a description for them is omitted. According to this example, a semiconductor layer made of AlAs or the like which is likely to be selectively oxidized is intervened between the light emitting layer forming portion 6 and the upper multilayer reflection film 8 and the semiconductor laminated portion 9 is formed. Then, it is etched away except for the current injection region and its periphery to be in the form of mesa. Then, oxidation treatment is performed in the atmosphere of water vapor so that the AlAs layer is oxidized especially from an exposed outer periphery to form the current blocking layer 7 in which the central region is not oxidized and serves as the current injection region A as shown in FIG. 3. In addition, the current blocking layer is not always formed by the selective oxidation and it may be formed by intervening a different conductivity type semiconductor layer or an insulating layer in which only the current injection region is removed like in the case of the conventional stripe type semiconductor laser.

Figure 4A:
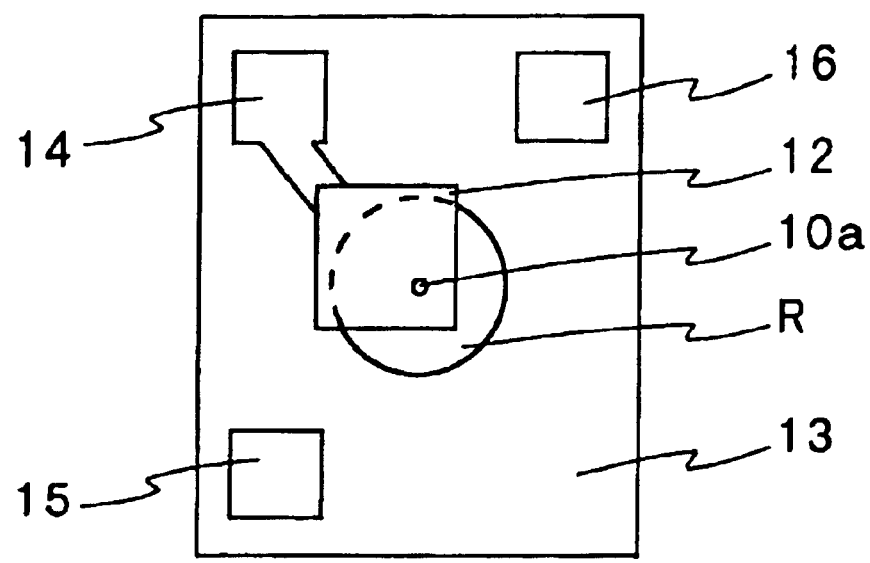
FIG. 4A is a plan view showing an example in which a chip of a semiconductor laser in accordance with the present invention is mounted on a light receiving element and FIG. 4B is a sectional view showing an example of a composition of a canned type semiconductor laser.
Figure 4B:
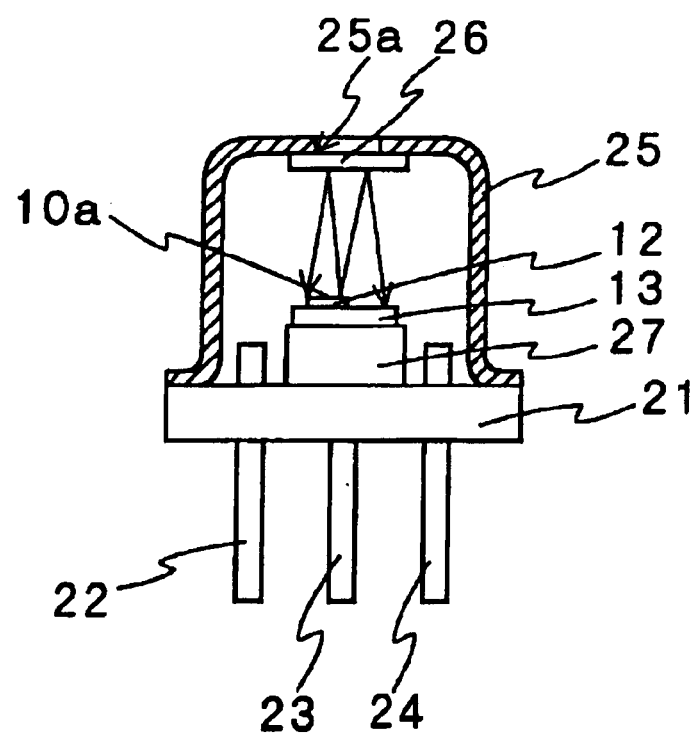
Figure 5:
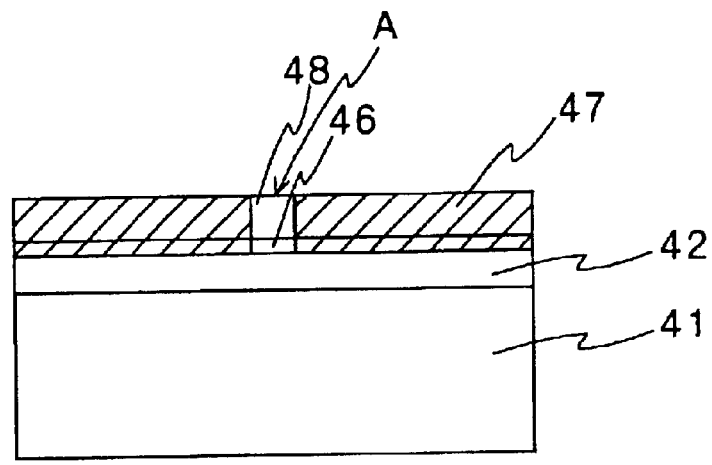
FIG. 5 is a sectional view showing one example of a conventional surface light emitting type laser.
Figure 6:
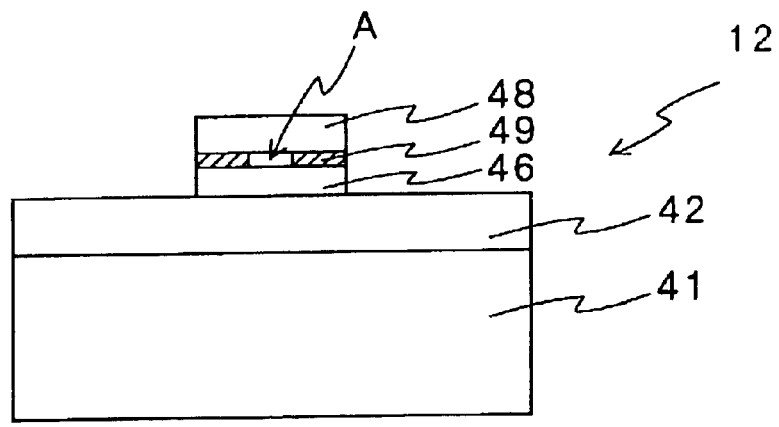
FIG. 6 is a sectional view showing another example of a conventional surface light emitting type laser.
Figure 7:
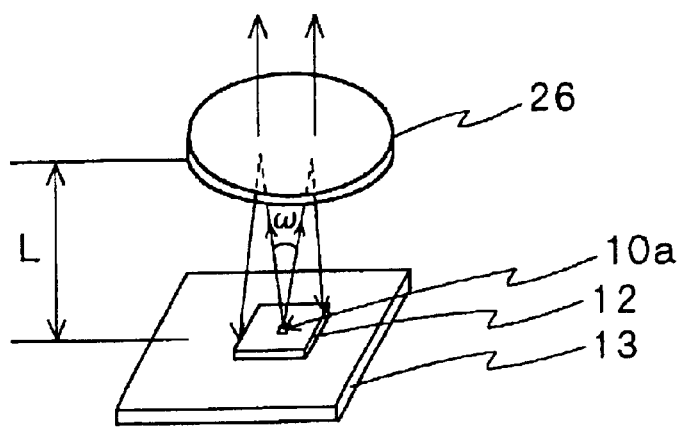
FIG. 7 is a view showing an example in which a light emitting power is monitored using a surface light emitting type laser.

Thus formed laser chip 12 is mounted on the light receiving element 13 almost in the center thereof as shown in FIG. 4A. The element 13 is made of silicon and its size is, for example about 1 mm by 0.8 mm. In addition, reference numeral 14 designates a common electrode pad of the lower electrode of the laser chip 12 and one electrode of the light receiving element 13, reference numeral 15 designates an electrode pad connecting the upper electrode of the laser chip 12 by wire, and reference numeral 16 designates an electrode pad connecting the other electrode of the light receiving element 13. The light receiving element 13 on which the laser chip 12 is mounted is mounted on a heat sink 27 of a stem 21 in case of a canned type semiconductor laser as shown in FIG. 4B. Each of the electrode pads provided on the above light receiving element 13 is bonded through wire (not shown) to leads 22, 23 and 24 which are provided in a stem 21 by lead or the like and they are covered by a cap 25. A through hole 25a for transmitting light is formed in the center of the top of the cap 25 and a transparent body 26 such as glass is attached thereto to form a transmission window. A laser beam is outputted through the transparent body 26.

According to the semiconductor laser of the present invention, as shown in FIGS. 4A and 4B, the laser chip 12 is mounted on the light receiving element 13 such that the beam outlet 10a of the laser chip 12 is to be positioned almost in the center of the light receiving element 13 and the outlet 10a of the laser chip 12 is positioned so as to be just under the through hole 25a (transmission window) on the stem 21. As a result, the reflected light from the transparent body 26 returns to the laser chip 12 and the light receiving element 13 in the form of a circle centering around the outlet 10a as shown by R in FIG. 4A and most of the reflected light is detected by the light receiving element 13. More specifically, even when the distance between the laser chip 12 and the transparent body 26 is short and the projected area R of the reflected light is small, almost half of the reflected light (when deflected toward only one side) or ¾ (when deflected toward two adjacent sides, that is, toward the corner) is projected onto the light receiving element 13, so that it can be sufficiently detected and precisely monitored.

According to the surface light emitting type semiconductor laser of the present invention, since the outlet of the laser beam is not positioned in the center of the laser chip but deflected toward the side thereof, when the laser chip is mounted on the light receiving element and the light emitting power of the laser chip is monitored by the reflected light, about a half of the reflected light can be surely projected onto the light receiving element and surely monitored even if the distance between the laser chip and the reflection surface such as the transparent body is short and the projected area of the reflected light is small. As a result, even if the light emitting power of the laser chip is changed because of an operation temperature or the like, its driving voltage is adjusted by an automatic controller each time, so that it can serve as a light source which outputs light constantly.

Although preferred examples have been described in some detail it is to be understood that certain changes can be made by those skilled in the art without departing from the spirit and scope of the invention as defined by the appended claims.

What is claimed is:

1. A surface light emitting type semiconductor laser having a vertical cavity comprising:
    a substrate; and
    a semiconductor laminated portion which has a lower multilayer reflection film, a light emitting layer forming portion and an upper multilayer reflection film sequentially formed directly on said substrate, said semiconductor laminated portion having a current injection region being defined by current blocking region formed in a part of said semiconductor laminated portion,
    wherein said semiconductor laminated portion has an outlet so as to emit a light from a surface of said current injection region, and said outlet is offset from a center of said substrate on which said semiconductor laminated portion is formed.

2. A semiconductor laser according to claim 1, wherein said substrate is in the form of a square and said current injection region is formed so as to be offset toward a corner of said square substrate.

3. A semiconductor laser according to claim 1, wherein said outlet is provided on a surface of said upper multilayer reflection film almost in a center of said current injection region and is formed so as to be away from the center of said substrate toward one side thereof by 20 µm or more.

4. A semiconductor laser according to claim 1, wherein said outlet is provided on a surface of said upper multilayer reflection film almost in a center of said current injection region and is formed so as to be away from the center of said substrate toward one side thereof by ⅙ to ⅛ or more of a length of one side of said substrate.

5. A semiconductor laser according to claim 1, wherein said substrate is in the form of a square and said outlet is provided on a surface of said upper multilayer reflection film almost in a center of said current injection region and is formed at a position away from one end face of said substrate by 20 µm to 70 µm.

6. A semiconductor laser according to claim 1, wherein said light emitting layer forming portion has a structure in which an active layer is sandwiched by lower and upper spacer layers made of a semiconductor having a band gap larger than that of said active layer to confine a carrier in said active layer.

7. A semiconductor laser according to claim 6, wherein said active layer is of a quantum well structure.

8. A semiconductor laser according to claim 6, wherein said active layer and said spacer layers are formed of an AlGaAs based compound semiconductor.

9. A semiconductor laser according to claim 1, wherein said current injection region is formed by insulating a peripheral part of said light emitting layer forming portion by ion implantation.

10. A semiconductor laser according to claim 1, wherein said current injection region is formed by interposing a current blocking layer between said light emitting layer forming portion and said upperor lower multilayer reflection film for preventing current injection except in said current injection region.

11. A semiconductor laser according to claim 10, wherein said current blocking layer is made of AlAs and has an oxide region formed by oxidizing a peripheral part thereof to define said current injection region.

12. A semiconductor laser assembly comprising:
    a stem;
    a light receiving element mounted on one surface of said stem;
    a surface light emitting type laser chip with a vertical cavity mounted on a surface of said light receiving element, said laser chip comprising a substrate, a semiconductor laminated portion which has a lower multilayer reflection film, a light emitting layer forming portion and an upper multilayer reflection film sequentially formed directly on said substrate, a current injection region being defined by a current blocking region formed in a part of said semiconductor laminated portion, said semiconductor laminated portion having an outlet so as to emit a light from a surface of said current injection region, and said outlet being offset from a center of said substrate on which said semiconductor laminated portion is formed; and
    a cap having a light transmission window formed of a transparent body in a center thereof and attached to said stem so as to cover said laser chip and said light receiving element,
    wherein said outlet is positioned so as to be under a center of said light transmission window.

13. A semiconductor laser assembly according to claim 12, wherein said light transmission window is disposed so as to be perpendicular to a laser beam radiated from said outlet.

14. A semiconductor laser assembly according to claim 12, wherein said laser chip is mounted on said light receiving element so that said outlet is positioned almost in a center of said light receiving element.

* * * * *